United States Patent
Park

(10) Patent No.: US 8,331,173 B2
(45) Date of Patent: Dec. 11, 2012

(54) DATA STROBE CLOCK BUFFER IN SEMICONDUCTOR MEMORY APPARATUS, METHOD OF CONTROLLING THE SAME, AND SEMICONDUCTOR APPARATUS HAVING THE SAME

(75) Inventor: Heat-Bit Park, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/162,399

(22) Filed: Jun. 16, 2011

(65) Prior Publication Data

US 2011/0242910 A1    Oct. 6, 2011

Related U.S. Application Data

(62) Division of application No. 12/266,265, filed on Nov. 6, 2008, now Pat. No. 7,969,792.

(30) Foreign Application Priority Data

Feb. 14, 2008    (KR) .................. 10-2008-0013467

(51) Int. Cl.
G11C 7/00    (2006.01)
(52) U.S. Cl. ............... 365/193; 365/189.05; 365/233
(58) Field of Classification Search ........... 365/189.05, 365/193, 233, 194, 230.08, 227, 189.03, 365/230.03, 189.08, 230.06, 203, 189.16
See application file for complete search history.

(56) References Cited

U.S. PATENT DOCUMENTS

| | | | |
|---|---|---|---|
| 6,205,084 B1* | 3/2001 | Akaogi | .................. 365/233.1 |
| 6,862,248 B2 | 3/2005 | Shin | |
| 7,102,937 B2 | 9/2006 | Mukerjee et al. | |
| 7,143,258 B2 | 11/2006 | Bae | |
| 7,224,625 B2 | 5/2007 | Dietrich et al. | |
| 7,684,260 B2* | 3/2010 | Ko | ..................... 365/189.05 |
| 7,969,792 B2* | 6/2011 | Park | ..................... 365/189.05 |
| 2005/0254307 A1 | 11/2005 | Dietrich et al. | |
| 2008/0239832 A1 | 10/2008 | Ko | |

FOREIGN PATENT DOCUMENTS

| | | |
|---|---|---|
| KR | 100493477 | 5/2005 |
| KR | 1020060032428 | 4/2006 |

* cited by examiner

*Primary Examiner* — Dang Nguyen
(74) *Attorney, Agent, or Firm* — Baker & McKenzie LLP

(57) ABSTRACT

A data strobe clock buffer of a semiconductor memory apparatus includes a buffering block configured to buffer an external data strobe clock signal in response to a buffer enable signal to generate an internal data strobe clock signal, a timing discriminating block configured to discriminate toggle timing of the internal data strobe clock signal in response to a burst start signal and a burst length signal to generate a timing discrimination signal, and an enable controlling block configured to generate the buffer enable signal in response to the timing discrimination signal.

11 Claims, 4 Drawing Sheets

DATA STROBE CLOCK BUFFER IN SEMICONDUCTOR MEMORY APPARATUS, METHOD OF CONTROLLING THE SAME, AND SEMICONDUCTOR APPARATUS HAVING THE SAME

CROSS-REFERENCES TO RELATED PATENT APPLICATION

This is a divisional application of U.S. patent application Ser. No. 12/266,265, filed Nov. 6, 2008, titled "Data strobe clock buffer in semiconductor memory apparatus, method of controlling the same, and semiconductor apparatus having the same," the disclosure of which is incorporated herein by reference in its entirety as if set forth in full, and which claims priority under 35 U.S.C. 119(a) to Korean Application No. 10-2008-0013467, filed on Feb. 14, 2008, in the Korean Intellectual Property Office, the disclosure of which is incorporated herein by reference in its entirety as if set forth in full.

BACKGROUND

1. Technical Field

The embodiments described herein relate to a semiconductor memory apparatus, and more particularly to a data strobe clock buffer of a semiconductor memory apparatus, and a method of controlling the same.

2. Related Art

Generally, a semiconductor memory apparatus includes a plurality of data input buffers and a plurality of data strobe clock buffers, which receive data signals and data strobe clock signals, to perform a data input operation. The data strobe clock signals are input in the form of a clock signal pair, and a data strobe clock buffer in the semiconductor memory apparatus buffers the external data strobe clock signals to generate internal data input strobe clock signals. The semiconductor memory apparatus, such as a double data rate synchronous dynamic random access memory (DDR SDRAM), uses the internal data input strobe clock signals generated from the data strobe clock buffer to perform an operation of generating a rising data input strobe clock signal and a falling data input strobe clock signal, thereby strobing data to a rising edge and a falling edge of the external clock.

The data strobe clock buffers operate in response to buffer enable signals. For example, the data strobe clock buffer performs the aforementioned buffering operation during time intervals where the buffer enable signals are enabled and stops the buffering operating if the buffer enable signals are disabled. The buffer enable signals are signals generated using the clock signals in the semiconductor memory apparatus. Accordingly, the semiconductor memory apparatus uses the internal clock signals to generate the buffer enable signals and defines the operation intervals of the data strobe clock buffers using the generated buffer enable signals.

However, as the operational speed of the semiconductor memory apparatus increases, sensitive reaction by the semiconductor memory apparatus to small jitter components of the external data strobe clock signals and the external clocks signals increases. For example, when toggle timings of the external data strobe clock signals are fast or toggle timings of the external clock signals are slow, the ending time of the enable interval of the buffer enable signal is delayed, and the data strobe clock buffer malfunctions by providing output of unwanted data. Such a malfunction causes a circuit region to receive subsequent data that incorrectly recognizes non-data as real data while degrading the stability in the data input operation.

The malfunction is caused by the generation of buffer enable signals without considering that the external data strobe clock signals and the external clock signals have different clock domains. For example, the operations that define the enable time intervals and buffer the external data strobe clock signal are performed using the clock signals having different clock domains. However, the buffer enable signals do not have accurate enable time intervals due to adverse influences, such as the environment and noise. Accordingly, the semiconductor memory apparatus does not stably generate the rising data input strobe clock signals and the falling data input strobe clock signals and are, therefore, vulnerable to data input errors.

SUMMARY

A data strobe clock buffer in a semiconductor memory apparatus, and a method of controlling the same capable of supporting a stable data input operation without being affected by environment and external jitters are described herein.

In one aspect, a data strobe clock buffer in a semiconductor memory apparatus includes a buffering block configured to buffer an external data strobe clock signal in response to a buffer enable signal to generate an internal data strobe clock signal, a timing discriminating block configured to discriminate toggle timing of the internal data strobe clock signal in response to a burst start signal and a burst length signal to generate a timing discrimination signal, and an enable controlling block configured to generate the buffer enable signal in response to the timing discrimination signal.

In another aspect, a method of controlling a data strobe clock buffer of a semiconductor memory apparatus includes enabling a buffer enable signal, generating an internal strobe clock signal by buffering an external data strobe clock signal pair, disabling the buffer enable signal by discriminating toggle timing of the internal data strobe clock signal according to a burst length of data input to the semiconductor memory apparatus, and stopping the buffering operation for the external data strobe clock signal pair.

In still another aspect, a semiconductor apparatus includes a semiconductor memory apparatus; a buffering block connected to the semiconductor memory apparatus buffering an external data strobe clock signal and generating an internal data strobe clock signal in response to a buffer enable signal; a timing discriminating block discriminating a toggle timing of the internal data strobe clock signal and generating a timing discrimination signal in response to a burst start signal and a burst length signal of data input to the semiconductor memory apparatus; and an enable controlling block generating the buffer enable signal in response to the timing discrimination signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
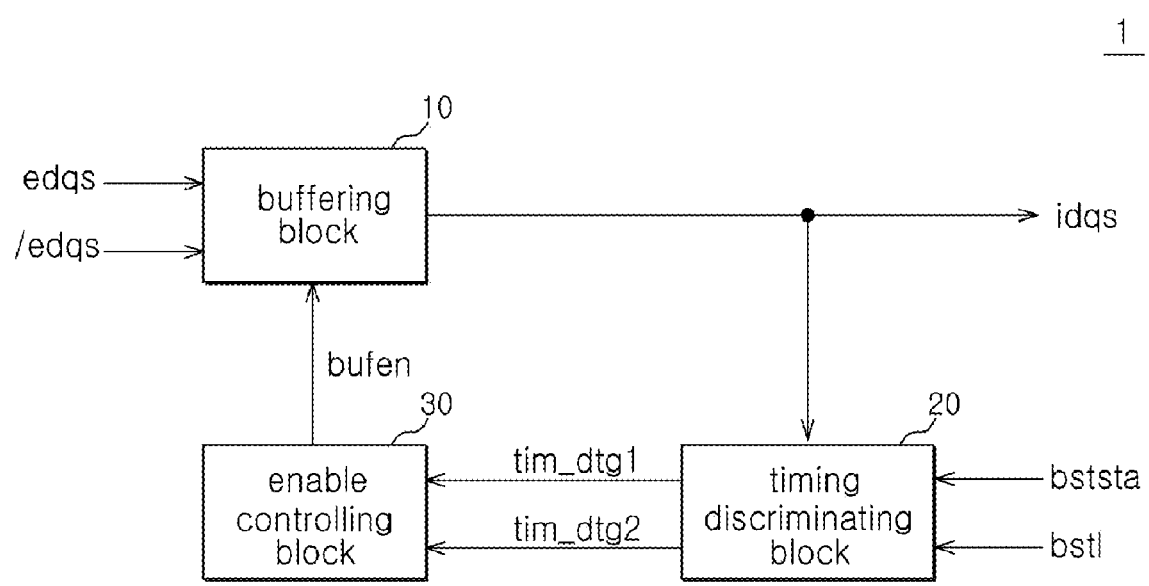
FIG. 1 is a schematic block diagram of an exemplary data strobe clock buffer in a semiconductor memory apparatus according to one embodiment.

FIG. 1 is a schematic block diagram of an exemplary data strobe clock buffer in a semiconductor memory apparatus according to one embodiment. Referring to FIG. 1, a data strobe clock buffer 1 in a semiconductor memory apparatus can be configured to include a buffering block 10, a timing discriminating block 20, and an enable controlling block 30.

The buffering block 10 can buffer an external data strobe clock signal pair 'edqs, /edqs' in response to a buffer enable signal 'bufen' to generate an internal data strobe clock signal 'idqs'. The timing discriminating block 20 can discriminate a toggle timing interval of the internal data strobe clock signal 'idqs' in response to a burst start signal 'bststa' and a burst length signal 'bst1' to generate a first timing discrimination signal 'tim_dtg1' and a second timing discrimination signal 'tim_dtg2'. The enable controlling block 30 can generate the buffer enable signal 'bufen' in response to the first timing discrimination signal 'tim_dtg1' and the second timing discrimination signal 'tim_dtg2'.

The buffering block 10 can buffer the external data strobe clock signal pair 'edqs, /edqs' during an enable time interval of the buffer enable signal 'bufen' to generate the internal data strobe clock signal 'idqs'. The buffer enable signal 'bufen' can be exemplified in an enabled state when a write operation of the semiconductor memory apparatus is initiated.

The burst start signal 'bststa' can be an enabled timing signal that can be followed by a write latency when the write operation of the semiconductor memory apparatus is initiated. The burst start signal 'bststa' can have an enable time interval corresponding to at least one period of the internal data strobe clock signal 'idqs'. For example, the burst length signal 'bst1', which is a signal represented as a burst length of the data input to the semiconductor memory apparatus, can perform a function of discriminating whether the burst length is 4 or 8. For purposes of an exemplary operation, the burst length signal 'bst1' can represent the burst length of 4 upon enabling and the burst length of 8 upon disabling.

If the burst start signal 'bststa' is enabled in a state where the burst length signal 'bst1' is enabled, then the timing discriminating block 20 can enable the first timing discrimination signal 'tim_dtg1' at a second rising edge time of the internal data strobe clock signal 'idqs'.

On the contrary, if the burst start signal 'bststa' is enabled upon disabling the burst length signal 'bst1', then the timing discriminating block 20 can enable the first timing discrimination signal 'tim_dtg1' at a fourth rising edge time of the internal data strobe clock signal 'idqs'.

Furthermore, the timing discriminating block 20 can use the internal data strobe clock signal 'idqs' to generate the second timing discrimination signal 'tim_dtg2'. Accordingly, the second timing discrimination signal 'tim_dtg2' can be implemented as a signal that has the same period as the internal data strobe clock signal 'idqs' and a pulse width narrower than the internal data strobe clock signal 'idqs'.

Thereafter, if the second timing discrimination signal 'tim_dtg2' is toggled in a state where the first timing discrimination signal 'tim_dtg1' is enabled, then the enable controlling block 30 can disable the buffer enable signal 'bufen'. The enable controlling block 30 can be configured to enable the buffer enable signal 'bufen' at a beginning of the write operation, and can define a disable starting time of the buffer enable signal 'bufen' in response to the first timing discrimination signal 'tim_dig1' and the second timing discrimination signal 'tim-dig2', as described above.

According to the one embodiment, the data strobe clock buffer of the semiconductor memory apparatus cannot be significantly affected by the external clock signals, and can detect how many times the internal data strobe clock signal 'idqs' generated by buffering the external data strobe clock signal pair 'edqs, /edqs' is toggled to determine the operational time interval only according to the detection result. Thus, since the clock signal domains that control the operation of the data strobe clock buffer can be unified, the data strobe clock buffer can show the same reaction even under the adverse effects of the environment and externally induced jitter, thereby performing the generation of rising/falling data input strobe clock signals in an improved stable manner.

Figure 2:
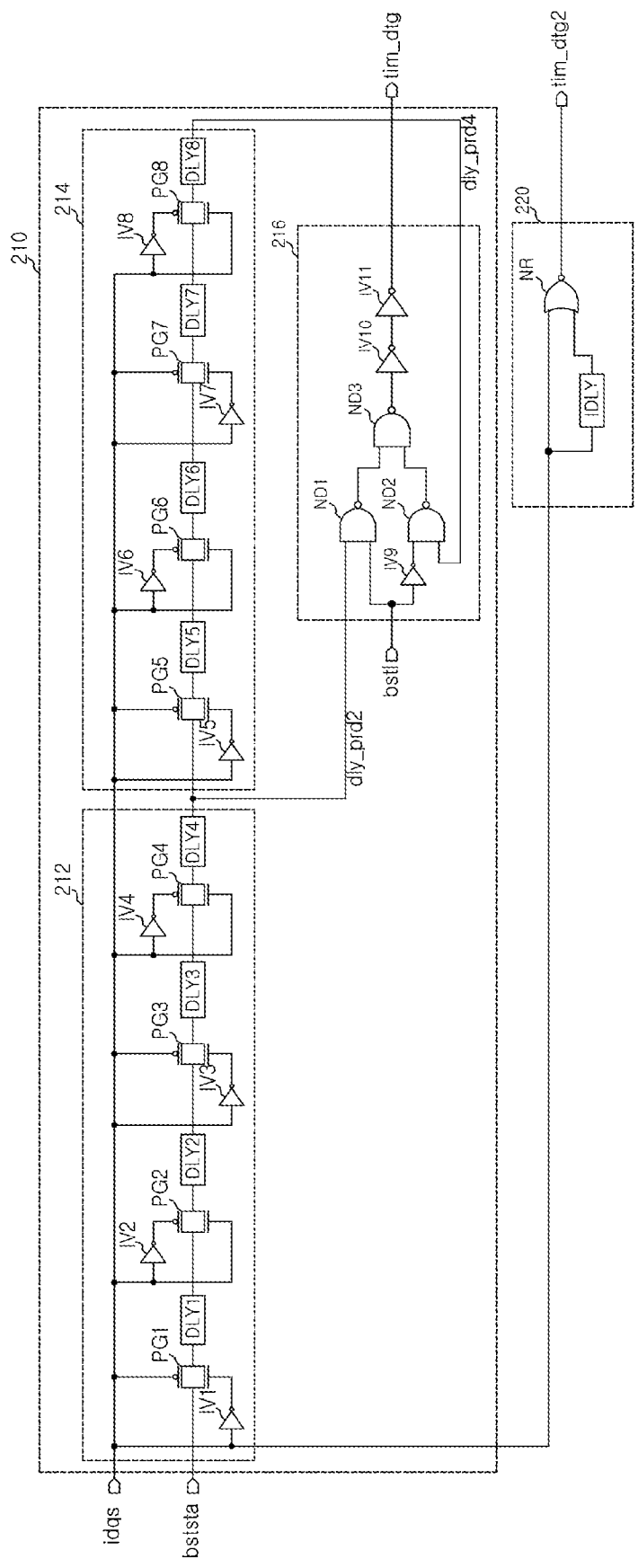
FIG. 2 is a schematic diagram of an exemplary timing discriminating block of FIG. 1 according to one embodiment.

FIG. 2 is a schematic diagram of an exemplary timing discriminating block of FIG. 1 according to one embodiment. Referring to FIG. 2, the timing discriminating block 20 can be configured to include a first signal generating unit 210 and a second signal generating unit 220.

The first signal generating unit 210 can generate the first timing discrimination signal 'tim_dtg1' in response to the burst start signal 'bststa', the burst length signal 'bst1', and the internal data strobe clock signal 'idqs'. The first signal generating unit 210 can be configured to include a two-period time delay section 212, a four-period time delay section 214, and a signal combination section 216.

If the burst start signal 'bststa' is enabled, then the two-period time delay section 212 can generate a two-period time delay signal 'dly_prd2' in which a level is changed after two time periods of the internal data strobe clock signal 'idqs'. The two-period time delay section 212 can include a first inverter IV1, a second inverter IV2, a third inverter IV3, a fourth inverter IV4, a first pass gate PG1, a second pass gate PG2, a third pass gate PG3, a fourth pass gate PG4, a first time delay device DLY1, a second time delay device DLY2, a third time delay device DLY3, and a fourth time delay device DLY4.

The first inverter IV1 can receive the internal data strobe clock signal 'idqs'. The first pass gate PG1 can pass the burst start signal 'bststa' in response to the internal data strobe clock signal 'idqs' and an output signal of the first inverter IV1. The first time delay device DLY1 can delay an output signal of the first pass gate PG1. The second inverter IV2 can receive the internal data strobe clock signal 'idqs'. The second pass gate PG2 can pass an output signal of the first time delay device DLY1 in response to the output signal of the second inverter IV2 and the internal data strobe clock signal 'idqs'. The second time delay device DLY2 can delay an output signal of the second pass gate PG2. The third inverter IV3 can receive the internal data strobe clock signal 'idqs'. The third pass gate PG3 can pass an output signal of the second time delay device DLY2 in response to the internal data strobe clock signal 'idqs' and an output signal of the third inverter IV3. The third time delay device DLY3 can delay an output signal of the third pass gate PG3. The fourth inverter IV4 can receive the internal data strobe clock signal 'idqs'. The fourth can pass gate PG4 can pass an output signal of the third time delay device DLY3 in response to an output signal of the fourth inverter IV4 and the internal data strobe clock signal 'idqs'. The fourth time delay device DLY4 can delay an output signal of the fourth pass gate PG4 to output the two-period time delay signal 'dly_prd2'.

The four-period delay unit 214 can delay the two-period time delay signal 'dly_prd2' by two time periods of the internal data strobe clock signal 'idqs' to generate the four-period time delay signal 'dly_prd4'. The four-period delay section

214 can be configured to include a fifth inverter IV5, a sixth inverter IV6, a seventh inverter IV7, an eighth inverter IV8, a fifth pass gate PG5, a sixth pass gate PG6, a seventh pass gate PG7, an eighth pass gate PG8, a fifth time delay device DLY5, a sixth time delay device DLY6, a seven time delay device DLY7, and an eighth time delay device DLY8.

The fifth inverter IV5 can receive the internal data strobe clock signal 'idqs'. The fifth pass gate PG5 can pass the two-period time delay signal 'dly_prd2' in response to the internal data strobe clock signal 'idqs' and an output signal of the fifth inverter IV5. The fifth time delay device DLY5 can delay an output signal of the fifth pass gate PG5. The sixth inverter IV6 can receive the internal data strobe clock signal 'idqs'. The sixth pass gate PG6 can pass an output signal of the fifth time delay device DLY5 in response to the output signal of the sixth inverter IV6 and the internal data strobe clock signal 'idqs'. The sixth time delay device DLY6 can delay an output signal of the sixth pass gate PG6. The seventh inverter IV7 can receive the internal data strobe clock signal 'idqs'. The seventh pass gate PG7 can pass an output signal of the sixth time delay device DLY6 in response to the internal data strobe clock signal 'idqs' and an output signal of the seventh inverter IV7. The seventh delayer DLY7 can delay an output signal of the seventh pass gate PG7. The eighth inverter IV8 can receive the internal data strobe clock signal 'idqs'. The eighth pass gate PG8 can pass an output signal of the seventh time delay device DLY7 in response to an output signal of the eighth inverter IV8 and the internal data strobe clock signal 'idqs'. The eighth time delay device DLY8 can delay an output signal of the eighth pass gate PG8 to output the four-period time delay signal 'dly_prd4'.

The signal combination section 216 can combine the two-period time delay signal 'dly_prd2' and the four-period time delay signal 'dly_prd4' in response to the burst length signal 'bst1' to generate the first timing discrimination signal 'tim_dtg1'. The signal combination section 216 can be configured to include a first NAND gate ND1, a second NAND gate ND2, a third NAND gate ND3, a ninth inverter IV9, a tenth inverter IV10, and an eleventh inverter IV11.

The first NAND gate ND1 can receive the burst length signal 'bst1' and the two-period time delay signal 'dly_prd2'. The ninth inverter IV9 can receive the burst length signal 'bst1'. The second NAND gate ND2 can receive an output signal of the ninth inverter IV9 and the four-period time delay signal 'dly_prd4'. The third NAND gate ND3 can receive an output signal of the first NAND gate ND1 and an output signal of the second NAND gate ND2. The tenth inverter IV10 can receive an output signal of the third NAND gate ND3. The eleventh inverter IV11 can receive an output signal of the tenth inverter IV10 to output the first timing discrimination signal 'tim_dtg1'.

The second signal generating unit 220 can generate the second timing discrimination signal 'tim_dtg2' in response to the internal data strobe clock signal 'idqs'. The second signal generating unit 220 can include an inverse time delay device IDLY and a NOR gate NR.

The inverse time delay device IDLY can invert and delay the internal data strobe clock signal 'idqs'. The NOR gate NR can receive the internal data strobe clock signal 'idqs' and an output signal of the inverse time delay device IDLY to output the second timing discrimination signal 'tim_dtg2'.

Accordingly, the two-period time delay signal 'dly_prd2' can be produced when the burst start signal 'bststa' is enabled in synchronization with the second rising edge time of the internal data strobe clock signal 'idqs'. Likewise, the four-period time delay signal 'dly_prd4' can be produced when the burst start signal 'bststa' is enabled in synchronization with the fourth rising edge time of the internal data strobe clock signal 'idqs'.

The signal combination section 216 can output the two-period time delay signal 'dly_prd2' as the first timing discrimination signal 'tim_dtg1' when the burst length signal 'bst1' is enabled. For example, when the burst length signal 'bst1' is disabled, i.e., the burst length is 8, the burst length is 4 and outputs the four-period time delay signal 'dly_prd4' as the first timing discrimination signal 'tim_dtg1'.

By using the second signal generating unit 220, as described above, the second timing discrimination signal 'tim_dtg2' can be produced as a signal that has the same period as the internal data strobe clock signal 'idqs' and a pulse width narrower than the internal data strobe clock signal 'idqs'. The second timing discrimination signal tim_dtg2 can be toggled while having the rising edge time at the falling edge time of the internal data strobe clock signal 'idqs'.

Figure 3:
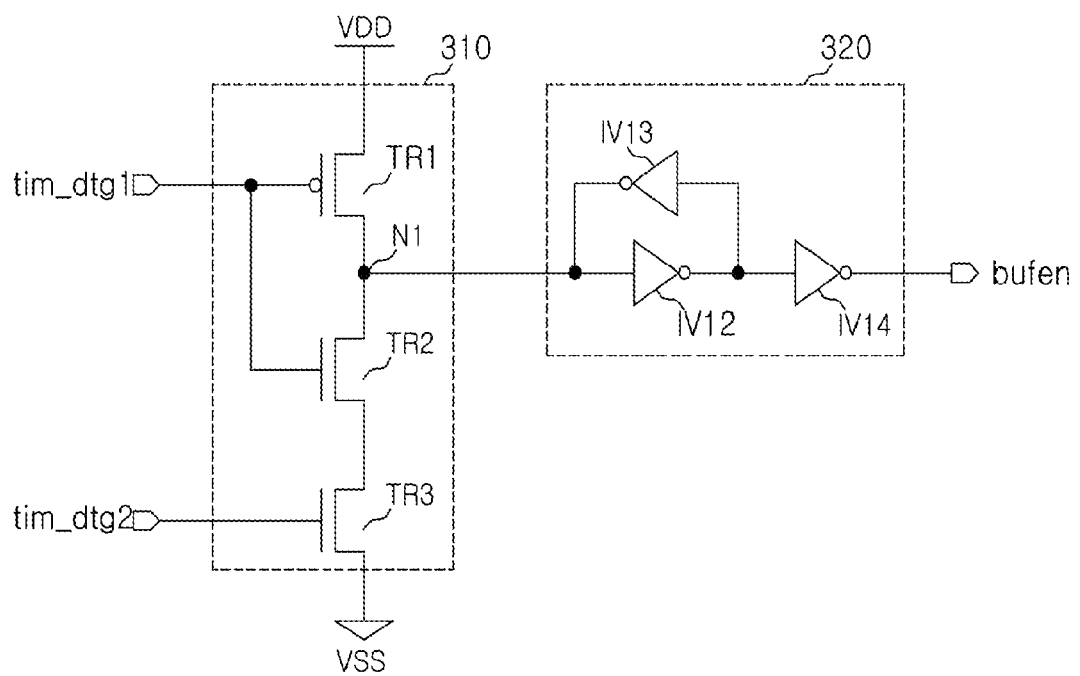
FIG. 3 is a schematic diagram of an exemplary enable controlling block of FIG. 1 according to one embodiment.

FIG. 3 is a schematic diagram of an exemplary enable controlling block of FIG. 1 according to one embodiment. Referring to FIG. 3, the enable controlling block 30 can be configured to include a first node N1, a level controlling unit 310, and a latch unit 320. The level controlling unit 310 can control a voltage level of the first node N1 in response to the first timing discrimination signal 'tim_dtg1' and the second timing discrimination signal 'tim_dtg2'.

The level controlling unit 310 can be arranged to include a first transistor TR1, a second transistor TR2, and a third transistor TR3. The first transistor TR1 can include a gate input that receives the first timing discrimination signal 'tim_dtg1', a source input provided with an external power supply voltage VDD, and a drain input connected to the first node N1. The second transistor TR2 can include a gate input that receives the first timing discrimination signal 'tim_dtg1' and a drain input connected to the first node N1. The third transistor TR3 can include a gate input that receives the second timing discrimination signal 'tim_dtg2', a drain input connected to a source terminal of the second transistor TR2, and source input that is connected to ground.

The latch unit 320 can latch and drive the voltage of the first node N1, and can include a twelfth inverter IV12, a thirteenth inverter IV13, and a fourteenth inverter IV14. The twelfth inverter IV12 can be supplied with the same voltage applied to the first node N1.

The thirteenth inverter IV13 together with the twelfth inverter IV12 can form a latch structure. The fourteenth inverter IV14 can receive an output signal of the twelfth inverter IV12 to output the buffer enable signal 'bufen'.

At the initial operation of the data strobe clock buffer in which the first timing discrimination signal 'tim_dtg1' can maintain a low level, the first node N1 can have a high-level voltage. Thus, the buffer enable signal 'bufen' can be enabled.

The first timing discrimination signal 'tim_dtg1' can vary the enable timing according to the burst length, and can have the enable time period by one time period of the internal data strobe clock signal 'idqs'. The second timing discrimination signal 'tim_dtg2' can be periodically toggled in synchronization with the falling edge time of the internal data strobe clock signal 'idqs'. The enable controlling block 30 can reduce the voltage of the first node N1 to a low level if the second timing discrimination signal 'tim_dtg2' is changed from a low level to a high level in a state where the first timing discrimination signal 'tim_dtg1' is enabled. Accordingly, the buffer enable signal 'bufen' can be disabled to a low level and the disable state of the buffer enable signal 'bufen' can be maintained to the falling edge time of the first timing discrimination signal 'tim_dtg1'.

As such, the enable controlling block 30 can perform an operation of setting the enable time interval of the buffer enable signal 'bufen' associated with the toggle timing of the internal data strobe clock signal 'idqs'. Thus, the buffering block 10 can have a stable buffering operation time interval even when the jitter components are included in the external data strobe clock signal pair 'edqs, /edqs'. Consequently, the buffering block 10 can clearly define the output time interval of the internal data strobe clock signal 'idqs' even when the waveform of the external data strobe clock signal pair 'edqs, /edqs' is changed. Thus, the buffering block 10 can prevent malfunction when the internal data strobe clock signal 'idqs' is toggled at an unwanted timing and when unwanted data is input.

Figure 4:
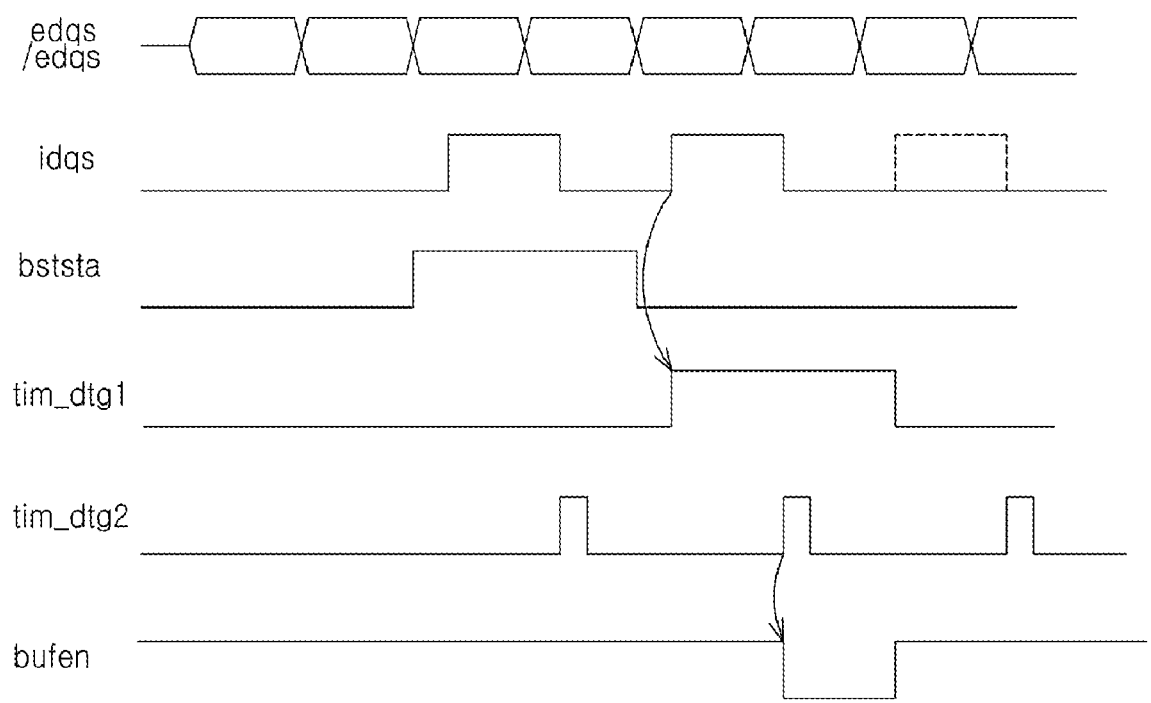
FIG. 4 is a timing diagram of an exemplary operation of a data strobe clock buffer in a semiconductor memory apparatus according to one embodiment.

FIG. 4 is a timing diagram of an exemplary operation of a data strobe clock buffer of a semiconductor memory apparatus according to one embodiment. In FIG. 4, waveforms of the external data strobe clock signal pair 'edqs, /edqs', the internal data strobe clock signal 'idqs', the burst start signal 'bststa', the first timing discrimination signal 'tim_dtg1', the second timing discrimination signal 'tim_dtg2', and the buffer enable signal 'bufen' are shown when the burst length is 4.

Referring to FIG. 4, the internal data strobe clock signal 'idqs' can be clock generated by buffering the external data strobe clock signal pair 'edqs, /edqs'. If the burst start signal 'bststa' is enabled, then the first timing discrimination signal 'tim_dtg1' can be enabled at the second rising edge time of the internal data strobe clock signal 'idqs'. The second timing discrimination signal 'tim_dtg2' can have the rising edge time at the falling time edge of the internal data strobe clock signal 'idqs'. Thus, if the second timing discrimination signal 'tim_dtg2' is toggled in a state where the first timing discrimination signal 'tim_dtg1' is at a high level, then the buffer enable signal 'bufen' can be disabled. Since the buffer enable signal 'bufen' is generated using the external clock, the enable time interval of the buffer enable signal 'bufen' can not be accurately set, thereby causing a malfunction when the internal data strobe clock signal 'idqs' is toggled at an unwanted timing, as shown by a dotted line in FIG. 4, for example. Conversely, the data strobe clock buffer of a semiconductor memory apparatus, according to the one embodiment, can more stably perform the operation by setting the operation interval generating the internal data strobe clock signal 'idqs' without being affected by the external clock.

As described above, the data strobe clock buffer of a semiconductor memory apparatus, according to the one embodiment, can buffer the external data strobe clock signal pair 'edqs, /edqs' to generate the internal data strobe clock signal, and can determine the enable time interval of the buffer enable signal using the generated internal data strobe clock signal. Accordingly, the buffer enable signal can be affected by the unified clock domains. As such, the buffering operation interval can be defined using only one clock domain, such that the data strobe clock buffer of a semiconductor memory apparatus can reduce the effects of a malfunction, such as a ringing phenomenon by the environment or by the external jitter. As such, the toggling of the internal data strobe clock signal during an unwanted time interval can be prevented, thereby making it possible to provide a stable data input operation.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A method of controlling a data strobe clock buffer in a semiconductor memory apparatus, comprising:
   enabling a buffer enable signal;
   generating an internal strobe clock signal by buffering an external data strobe clock signal pair;
   disabling the buffer enable signal by discriminating toggle timing of the internal data strobe clock signal according to a burst length of data input to the semiconductor memory apparatus; and
   stopping the buffering operation for the external data strobe clock signal pair.

2. The method of claim 1, wherein the disabling the buffer enable signal comprises:
   generating a timing discrimination signal by discriminating the toggle timing of the internal data strobe clock signal in response to a burst start signal and a burst length signal; and
   disabling the buffer enable signal in response to the timing discrimination signal.

3. The method of claim 2, wherein the timing discrimination signal includes a first timing discrimination signal and a second timing discrimination signal.

4. The method of claim 3, wherein the generating of the timing discrimination signal discriminates how many times the internal data strobe clock signal is toggled according to whether the burst length signal is enabled to enable the first timing discrimination signal.

5. The method of claim 4, wherein the generating of the timing discrimination signal further comprises generating the second timing discrimination signal having the same period as the internal data strobe clock signal and a pulse width narrower than the internal data strobe clock signal.

6. The method of claim 4, wherein the disabling the buffer enable signal in response to the timing discrimination signal disables the buffer enable signal if the second timing discrimination signal is toggled in a state where the first timing discrimination signal is enabled.

7. A method of controlling a semiconductor memory apparatus, comprising:
   controlling a data strobe clock buffer of the semiconductor memory apparatus by:
      starting a buffering operation for an external data strobe clock signal pair and enabling a buffer enable signal;
      generating an internal strobe clock signal by buffering the external data strobe clock signal pair;
      disabling the buffer enable signal by discriminating toggle timing of the internal data strobe clock signal according to a burst length of data input to the semiconductor memory apparatus; and
      stopping the buffering operation for the external data strobe clock signal pair.

8. The method of claim 7, wherein the disabling the buffer enable signal is controlled by a timing discrimination signal generated by discriminating the toggle timing of the internal data strobe clock signal in response to a burst start signal and a burst length signal of the input data.

9. The method of claim 8, further comprising generating a two-period time delay signal based upon a level change after two time periods of the internal data strobe clock signal when the burst start signal is enabled.

10. The method of claim 9, further comprising delaying the two-period time delay signal by two time periods of the internal data strobe clock signal to generate a four-period time delay signal.

11. The method of claim 10, further comprising combining the two-period time delay signal and the four-period time delay signal based upon the burst length signal to disable the buffer enable signal.

* * * * *